(12) United States Patent
Miura et al.

(10) Patent No.: US 6,492,829 B1
(45) Date of Patent: Dec. 10, 2002

(54) CONTACTOR FOR INSPECTION

(75) Inventors: Hideo Miura, Koshigaya (JP); Ryuji Kohno, Chiyoda (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/809,249

(22) Filed: Mar. 16, 2001

(30) Foreign Application Priority Data

Mar. 17, 2000 (JP) .................................... 2000-076118

(51) Int. Cl.$^7$ ..................... G01R 31/28; G01R 1/073
(52) U.S. Cl. ....................... 324/765; 324/754
(58) Field of Search ............................ 324/754, 762, 324/765, 763; 257/777, 48

(56) References Cited

U.S. PATENT DOCUMENTS 5,103,557 A * 4/1992 Leedy .................... 324/754
5,172,050 A * 12/1992 Swapp ................... 324/762
5,701,666 A * 12/1997 DeHaven ................ 324/754

FOREIGN PATENT DOCUMENTS

JP 10-270496 * 10/1998

* cited by examiner

Primary Examiner—Ernest Karlsen
(74) Attorney, Agent, or Firm—Antonelli, Terry, Stout, & Kraus, LLP.

(57) ABSTRACT

An inspection contactor is provided for inspecting electrical continuity of an inspected wafer by pushing probes against a predetermined location of the inspected wafer. The contactor may include a first silicon substrate provided on a main face thereof with the probes. A second silicon substrate may be located on another face of the first silicon substrate in which the another face is opposite to the main face of the first silicon substrate. A semiconductor circuit having a plurality of electrode pads may be located on the second silicon substrate. A third silicon substrate may be located on the second silicon substrate at a side opposite to the first silicon substrate. A plurality of outer terminals may be located on a face of the third silicon substrate in which the face is opposite to the second silicon substrate. The number of the outer terminals may be smaller than the number of the probes. Each of the plurality of electrode pads located in the semiconductor circuit may be electrically connected to the probes or the outer terminals.

14 Claims, 6 Drawing Sheets

CONTACTOR FOR INSPECTION

BACKGROUND OF THE INVENTION

The invention relates to a semiconductor device having an interconnection substrate and semiconductor integrated circuits located on the interconnection substrate, and an inspection contactor for inspecting the electrical continuity of a wafer to be inspected.

Hitherto, in order to realize with a low cost a semiconductor device or system LSI with high-degree, complicated functions by use of flip chip bonding in which a plurality of LSI chips are directly mounted on an interconnection substrate, a bump connection system using bumps formed of solder or metal is used as a mounting method for mounting, after independently producing chips each having a function such as micro-computer or memory etc., the produced chips on the interconnection substrate at a high density.

However, in the bump connection system using the bumps formed of the solder or metal, there is such a problem as thermal strain occurs in the bumps etc. due to difference in thermal expansion coefficient between the LSI chips and the interconnection substrate with the result that fatigue fracture occurs in the bumps etc.

As means for preventing this problem from occurring, there is a method in which a gap defined between the LSI chip and the interconnection substrate is filled with an epoxy type thermosetting resin in which fine particles (usually called "filler") such as glass particles etc. are included, so that thermal warp between the LSI chip and the interconnection substrate may be restrained, whereby thermal stress occurring in the metal bumps etc. are reduced to thereby improve the connection reliability of the metal bumps etc.

Further, a method disclosed in JP-A-10-270496 (a mounting method usually called "underfill structure") is known in which an anisotropic, conductive resin is used as the epoxy type thermosetting resin in which fine particles such as glass particles etc. are included. Or, as a method of realizing the system LSI, there is known a method comprising the steps of: arranging a plurality of chips, which are individually produced previously, on an identical plane; and then electrically connecting the chips to each other by use of thin film interconnection technique.

However, in the conventional methods explained above, there are such problems as a step of filling with resin is necessary after mounting the LSI chips on the interconnection substrate with the result that a production cost thereof becomes high, and as, in a case where troubles such as defective chip etc. are found in the reliability test etc. after the assembling thereof, the filled resin must be removed to exchange the defective LSI chip with the result that much labor is required.

Further, in a case where LSI chips are mounted at a high density, it becomes indispensable, due to the increase of generated-heat occurrence density of the whole of a device, to provide a heat-dissipating mechanism for improving the heat dissipation of the whole device, which impedes the small size design of the device.

In addition, in a case of using a bonding method other than the above method using the solder bumps, it is necessary to perform with high precision the alignment between a LSI chip and electrode pads located on an interconnection substrate, which has been an obstacle to the simplification of operations for mounting the LSI chip on the substrate.

SUMMARY OF THE INVENTION

The object of the invention is to obtain a semiconductor device and an inspection contactor both superior in heat dissipation in each of which a plurality of LSI chips are mounted on an interconnection substrate having substantially no difference in thermal expansion coefficient between the LSI chips and the substrate by use of means distinct from conventional bonding or connecting, whereby the exchange or mounting of the chips can be readily performed.

According to the first aspect of the invention, there is provided a semiconductor device comprising:

an inner cover made of a material containing silicon as the main constituent thereof in which inner cover LSI chips each provided with semiconductor integrated circuits are located;

an interconnection substrate made of a material containing silicon as the main constituent thereof and connected to the inner cover, the substrate being provided on the surface thereof with electrode terminals each formed to have a pyramid-like shape at a portion of a cantilever which electrode terminals are electrically in contact with the LSI chips, an interconnection layer connected to the electrode terminals, and electrodes for performing electrical connection to exterior portions which electrodes are connected to the interconnection layer, and an outer cover made of a metal other than silicon or a macromolecular material which outer cover covers the inner cover and the interconnection substrate.

Preferably, in the first aspect of the invention, the interconnection substrate and the inner cover are connected to each other through fitting portions.

According to the second aspect of the invention, there is provided a semiconductor device comprising:

a first inner cover made of a material containing silicon as the main constituent thereof in which is located at least one LSI chip provided with semiconductor integrated circuits;

a second inner cover made of a material containing silicon as the main constituent thereof in which is located at least one LSI chip provided with semiconductor integrated circuits;

an interconnection substrate made of a material containing silicon as the main constituent thereof, the substrate being provided on one face thereof with electrode terminals each formed to have a pyramid-like shape in a portion of a cantilever which electrode terminals are in electrical contact with the LSI chip located in the first inner cover, a first interconnection layer connected to the electrode terminals, and electrodes connected to the first interconnection layer which electrodes perform electric connection to exterior portions, the substrate being further provided on the other face thereof with electrode terminals each formed to have a pyramid-like shape in a portion of a cantilever which electrode terminals are in electrical contact with the LSI chip located in the second inner cover, a second interconnection layer connected to the electrode terminals formed on the other face of the substrate, and a third interconnection layer for connecting the first interconnection layer to the second interconnection layer, the one face of the interconnection substrate being connected to the first inner cover, the other face of the interconnection substrate being connected to the second inner cover; and an outer cover made of a metal different from silicon or a macromolecular material which outer cover covers the first inner cover, the second inner cover and the interconnection substrate.

Preferably, in the second aspect of the invention, the interconnection substrate, the first inner cover and the second inner cover are connected to each other through fitting portions.

According to the third aspect of the invention, there is provided a semiconductor device comprising:

a first inner cover made of a material containing silicon as the main constituent thereof in which is located at least one LSI chip provided with semiconductor integrated circuits;

a second inner cover made of a material containing silicon as the main constituent thereof in which is located at least one LSI chip provided with semiconductor integrated circuits;

a silicon cover with an interconnection substrate, the substrate being provided on one face thereof with electrode pads, electrode terminals each formed to have a pyramid-like shape in a portion of a cantilever which electrode terminals are in electrical contact with the electrode pads, and at least one LSI chip having semiconductor integrated circuits, the substrate being further provided on the other face thereof with electrode terminals each formed to have a pyramid-like shape in a portion of a cantilever which electrode terminals are in electrical contact with the LSI chip located in the second inner cover, an interconnection layer connected to the electrode terminals, another interconnection layer for connecting the electrode pads located on the one face of the substrate to the interconnection layer located on the other face thereof, the other face being connected to the second inner cover;

an interconnection substrate made of a material containing silicon as the main constituent thereof, the substrate being provided on one face thereof with electrode terminals each formed to have a pyramid-like shape in a portion of a cantilever which electrode terminals are in electrical contact with the LSI chip located in the first inner cover, a first interconnection layer connected to the electrode terminals, and electrodes connected to the first interconnection layer which electrodes perform electric connection to exterior portions, the substrate being further provided on the other face thereof with electrode terminals each formed to have a pyramid-like shape in a portion of a cantilever which electrode terminals are in electrical contact with the LSI chip located in the silicon cover, a second interconnection layer connected to the electrode terminals formed on the other face of the substrate which second interconnection layer is also connected to the electrode terminals formed on the one face of the silicon cover, and a third interconnection layer for connecting the first interconnection layer to the second interconnection layer, the one face of the interconnection substrate being connected to the first inner cover, the other face of the interconnection substrate being connected to the silicon cover having the interconnection layer; and an outer cover made of a metal different from silicon or a macromolecular material which outer cover covers the first inner cover, the second inner cover and the interconnection substrate.

Preferably, in the third aspect of the invention, each of the pairs of the interconnection substrate and the first inner cover; the interconnection substrate and the silicon cover having the interconnection layer; and the silicon cover and the second inner cover is connected to each other through fitting portions.

In each of the first to third aspects of the invention, it is preferred that electric parts such as capacitors and/or resistors and/or transistors are mounted in the first inner cover. In addition, in each of the first to third aspect of the invention and the preferred aspects, it is preferred that the first inner cover is provided with concave portions each formed to receive at least the LSI chip, and that at the bottom of each of the concave portions is provided a height variation-reducing layer having high thermal conductivity and superior flexibility.

According to the fourth aspect of the invention, there is provided an inspection contactor for performing the inspection of electrical continuity of a wafer to be inspected, by forcing probes onto a predetermined location of this wafer through a pushing substrate, the inspection contactor comprising:

a first silicon substrate (, i.e., a silicon cover 38) having the probes (, i.e., electrode terminals) formed on a main face of the first silicon substrate;

a second silicon substrate (, i.e., LSI chip 37) provided on the other face opposite to the main face of the first silicon substrate;

a semiconductor circuit: having a plurality of electrode pads formed on the second silicon substrate;

a third silicon substrate (, i.e., interconnection substrate 6a) provided at a side of the second silicon substrate which side is opposed to the first silicon substrate; and a plurality of external terminals formed on the face of the third silicon substrate which face is opposed to the second silicon substrate, the number of the external terminals being smaller than the number of the probes, each of the electrode pads formed in the semiconductor circuit being electrically connected to the probes or the external terminals.

In the fourth aspect of the invention, it is preferred that a concave portion is formed in a face opposite to the main face of the first substrate, and that, in the concave portion, the second silicon substrate is positioned.

Further, in the fourth aspect of the invention, it is preferred that the first silicon substrate or the third silicon substrate is provided with electrode terminals each formed to have a pyramid-like shape at a portion of a cantilever, and that electrode pads formed in the semiconductor circuit are electrically connected to the probes or to the external terminals by means of the electrode terminals.

Preferably, in the fourth aspect of the invention, the semiconductor circuit is a multiplex circuit.

The contactor of the invention comprises the inner cover in which the LSI chips are mounted, the electrode terminals each formed to have a pyramid-like shape at a portion of a cantilever, an interconnection layer electrically connecting the electrode terminals, and electrode pads and another interconnection layer both for performing external electrical connection.

The LSI chips are electrically mounted directly by the contacting thereof through the electrode terminals, without using any bumps used in the conventional bonding or connecting. The cantilever structure is adopted for readily bringing about compressive force at the contacting portions between the electrode terminals and the chip, whereby the electrical connection can be stabilized. In this case, since the compressive force is regulated by the structure of the lever and the amount of the deflection thereof, it is possible to prevent excessive force from being applied to the contacting portions. By use of this connecting method, the exchanging of the chip etc. can be readily performed. Further, since the interconnection substrate is made of silicon, the difference in thermal expansion coefficient between the substrate and the LSI chip becomes very small, so that reinforcing resin used in conventional technique becomes unnecessary, and it is effective to reduce the production cost.

Further, the LSI chips are covered by the inner cover made of the material containing silicon as the main constituent thereof, and both of the interconnection substrate and the inner cover of silicon are connected to each other through the fitting portions. In the cover, the concave portions for positioning the LSI chips are formed previously. As regards all of these concave portions and the cantilever etc. provided on the interconnection substrate, it is possible to perform micro-working by conventional LSI-producing technique or micro-machining technique.

In addition, by using the connecting structure in which the cover and the interconnection substrate are connected to each other by the fitting of them, the positioning between the cover and the interconnection substrate can be performed readily. Thus, by the steps of inserting the LSI chips into the cover and overlapping the interconnection substrate with the cover by the fitting, the positioning of the LSI chips and the interconnection substrate and the mounting of the LSI chips can be performed readily. In this case, by use of the cover formed of silicon, the heat occurring in the LSI chips can be readily dissipated, so that the heat dissipation characteristic of the whole of the semiconductor device is enhanced.

Further, by adopting such structure as the whole structure covered by the inner cover is further covered by the outer cover made of a metal other than silicon or macromolecular material which outer cover is provided with external electrode terminals, it becomes easy to perform the handling thereof and to enhance the mechanical reliability thereof.

DETAILED DESCRIPTION OF THE PREFERRED EMBODIMENTS

The first embodiment of the invention is described below while referring to FIGS. 1 to 5.

Figure 1:
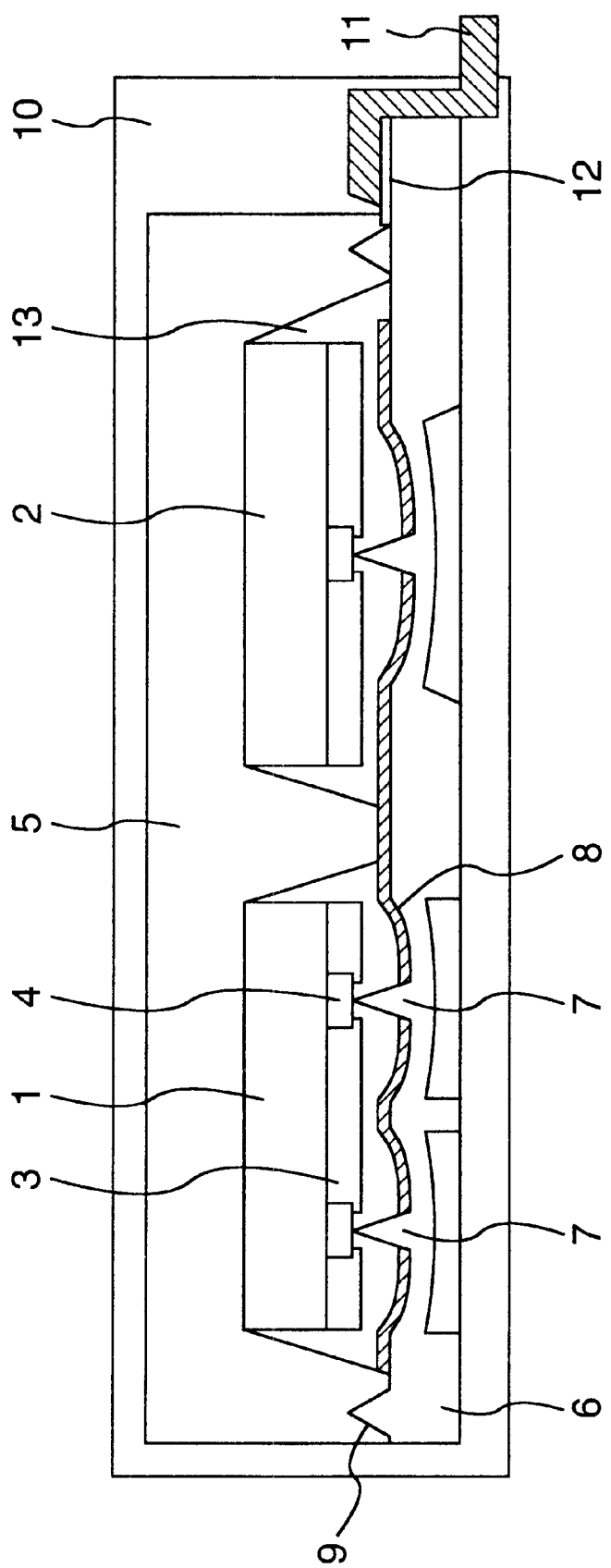
FIG. 1 is a schematic sectional view of a semiconductor device according to the first embodiment of the invention.
Figure 2:
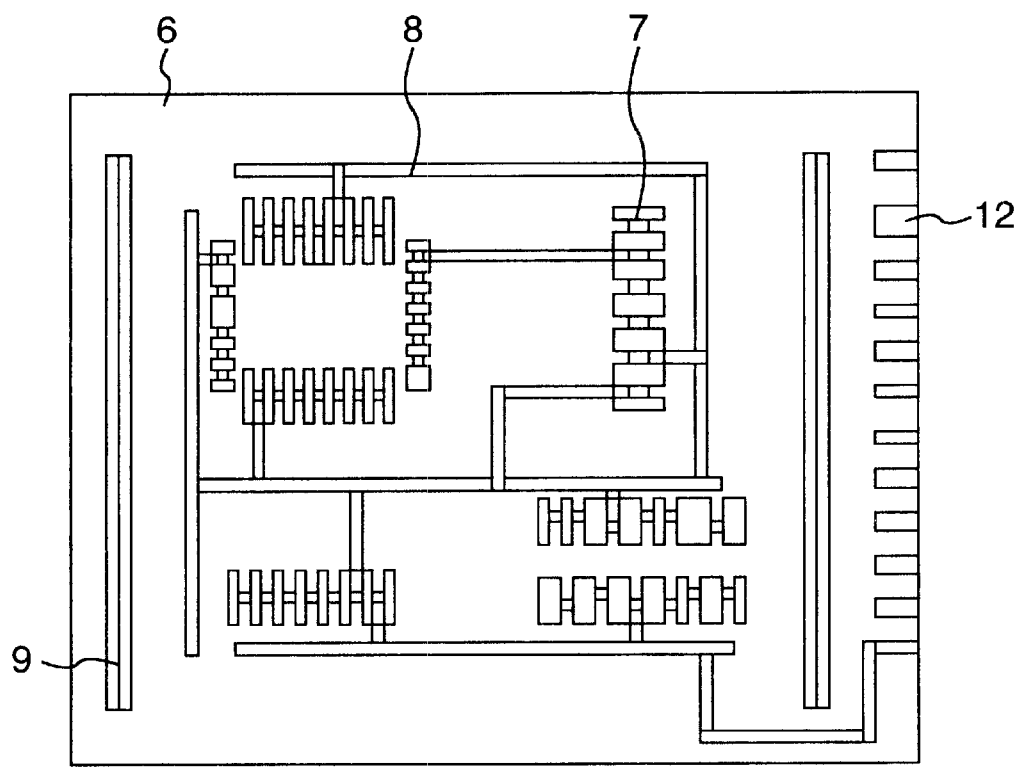
FIG. 2 is a schematic surface view of the interconnect silicon substrate used in the semiconductor device according to the first embodiment of the invention.
Figure 3:
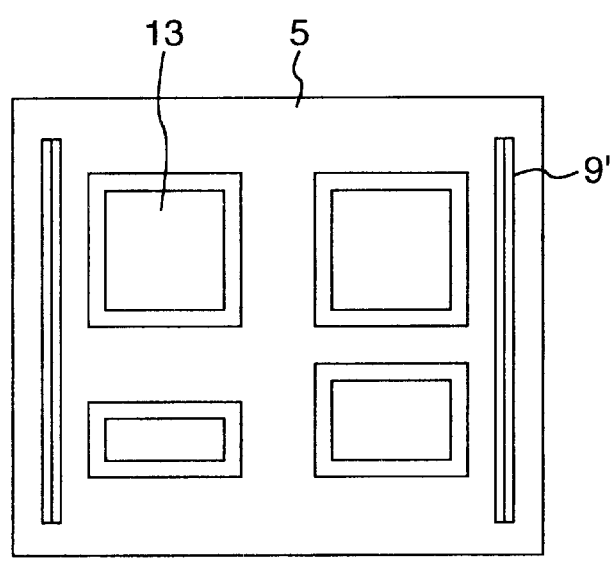
FIG. 3 is a schematic surface view of the silicon cover used in the semiconductor device according to the first embodiment of the invention.
Figure 4:
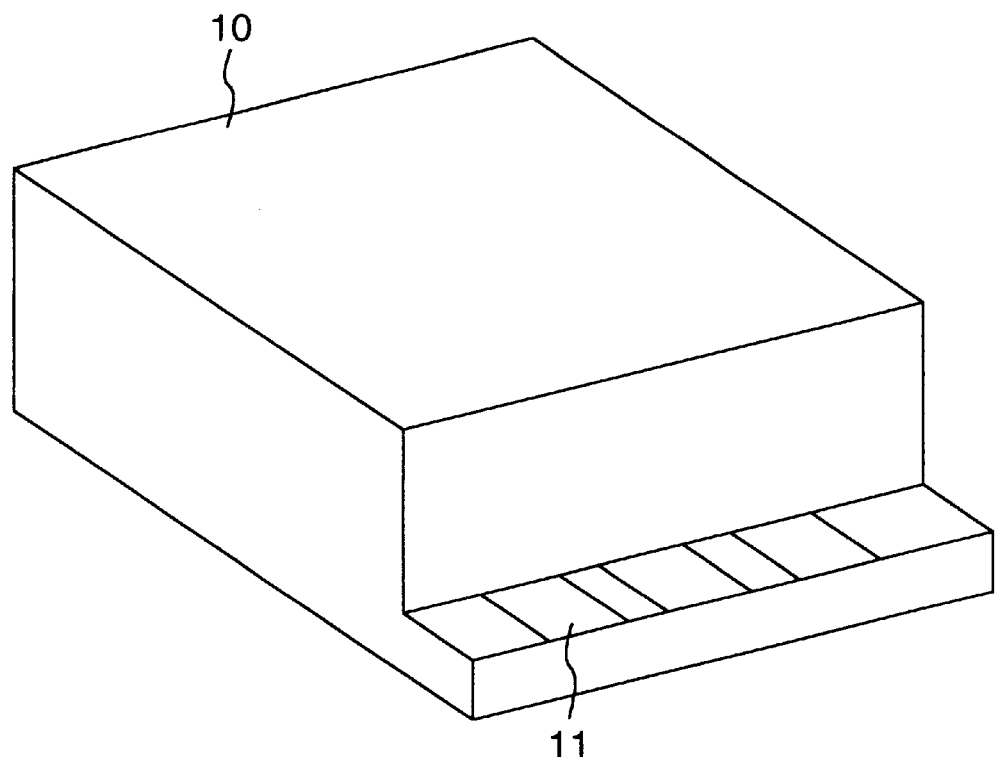
FIG. 4 is a schematic perspective view of the semiconductor device according to the first embodiment of the invention.
Figure 5:
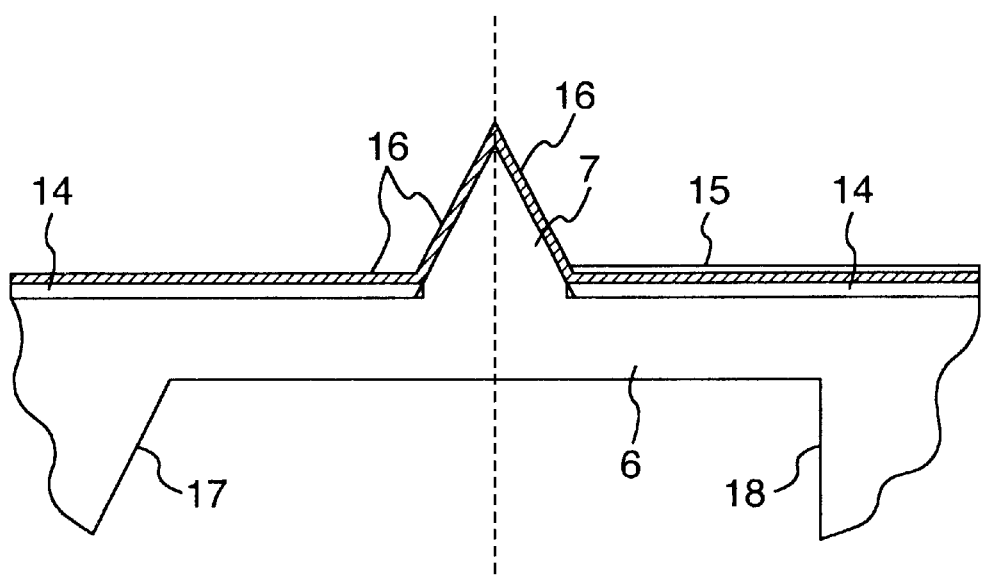
FIG. 5 is a schematic sectional view of the cantilever portion formed on the surface of the interconnect silicon substrate used in the semiconductor device according to the first embodiment of the invention.

FIG. 1 is a schematic sectional view of a semiconductor device according to the first embodiment of the invention, FIG. 2 being a schematic surface view of the interconnect silicon substrate used in the semiconductor device according to the first embodiment of the invention, FIG. 3 being a schematic surface view of the silicon cover used in the semiconductor device according to the first embodiment of the invention. Further, FIG. 4 is a schematic perspective view of the semiconductor device according to the first embodiment of the invention, and FIG. 5 is a schematic sectional view of the cantilever portion formed on the surface of the interconnect silicon substrate used in the semiconductor device according to the first embodiment of the invention.

In FIG. 1, each of a plurality of LSI chips 1 and 2 has an outermost surface interconnect layer 4 and a surface protective layer 3. An interconnection substrate 6 is provided with a plurality of electrode terminals 7 each formed to have a pyramid-like shape at a portion of a cantilever which electric terminals are in electrical contact with the outermost surface interconnect layer 4 of each of the LSI chips 1 and 2, an interconnect layer 8 for connecting the electrode terminals to each other to thereby electrically connect the LSI chips 1 and 2, and another interconnect layer and electrode pads 12 for electrically connecting the LSI chips to exterior portions. These electrode terminals 7, interconnect layer 8 and electrode pads are formed on the surface portion of the interconnection substrate 6 made of silicon.

The LSI chips 1 and 2 are electrically mounted directly onto the interconnection substrate 6 through the electrode terminals 7 without using any connecting bumps used in conventional bonding or connecting technique. The interconnect layer 8 is formed of a layered structure comprising a conductive layer and an insulating layer, each of which conductive layer and insulating layer may be made to have a plurality of laminated, thin films. However, in the case where the conductive layer is formed of a plurality of laminated thin films, it is necessary to perform electrical insulation between the conductive films. As regards the thickness of the insulating layer in the interconnect layer 8, it is preferred that this thickness is in the range of several micron meters to several ten micron meters for the purpose of achieving the impedance regulating or matching, and particularly in a case where no transmission of high frequency signals exceeding 100 MHz is necessary, the thickness of the insulating layer may be not more than 1 micron meter if circumstances require.

The LSI chips 1 and 2 are covered with a cover 5 (inner cover) made of the material containing silicon as the main component thereof, and both of the interconnect layer 6 and the silicon cover 5 are connected to each other through fitting portions 9 (, that is, convex portions or protrusions formed at the side of the interconnection substrate 6, and concave portions or grooves formed at the side of the cover 5). In the cover 5, as shown in FIG. 3, a plurality of concave portions 13 are previously formed which perform the positioning of the LSI chips 1 and 2. All of these concave portions 13, the cantilever 7 formed on the interconnection substrate 6 and etc. can be readily micro-worked by conventional LSI-producing technique or micro-machining technique. The cantilever electrode terminals 7 can be formed by various methods, and no particular method is limited regarding the forming thereof. Further, since the fitting connection structure brought about by the fitting portions 9 is adopted regarding the connection between the cover 5 and the interconnection substrate 6, the positioning of them can be readily performed.

Thus, in the embodiment of the invention, fitting grooves 9' are formed in the cover 5 at positions corresponding to the fitting protrusions 9 formed on the interconnection substrate 6. Accordingly, by the steps of inserting the LSI chips 1 and 2 in the positioning concave portions 13 formed in the cover 5 and then overlapping the interconnection substrate 6 with the cover 5 through the fitting portions 9, both of the positioning between the LSI chips 1, 2 and the interconnection substrate 6 (, i.e., the cantilever electrodes 7 formed on the substrate) and the mounting thereof can be readily performed.

Further, since the cover 5 is made substantially of silicon, heat occurring in the LSI chips are readily dissipated, so that the heat-dissipation characteristics of the whole of the semiconductor device is also enhanced. As shown in FIG. 4 regarding the appearance of the semiconductor device, the whole structure of the semiconductor device covered with the silicon cover 5 is further covered with the cover 10 (the outer cover) made of a metal other than silicon or a macromolecular material which cover 10 is provided with the external electrode terminals 11, whereby the handling thereof can be readily performed and the mechanical reliability thereof can be enhanced. The external electrode terminals 11 of the whole device are electrically connected to the electrode pads 12, as shown in FIG. 1. The structure of the external electrode terminals 11 may have any shape of sheet, pin, and groove and is not limited to a particular shape.

In FIG. 2 schematically showing the surface of the interconnection substrate 6, on the surface of the interconnection substrate 6 are provided the interconnection layer 8 and the cantilever electrode terminals 7 so that the LSI chips 1 and 2 are electrically connected to each other. The number of the cantilever electrode terminals 7 is selected according to the number of electrode pads provided on the outermost surface of the interconnection layer of the mounted LSI chips and is not limited to the electrode terminal number shown in the first embodiment. Further, the layout of the electrode terminals 7 may be any one of arrangement of one or plurality of rows at the center of the LSI chips, arrangement at the periphery of the chips, arrangement of two-dimensional area array, and random arrangement.

As regards the cantilever electrodes, since they are formed by conventional micro-machining technique, it is possible for one side of each of the pyramid-like shape d electrode terminals 7 to be formed to have a size from several micron meters to several tens micron meters, and it is also possible for the cantilevers to be formed at intervals ranging from several tens micron meters to several hundreds micron meters.

FIG. 5 is an enlarged sectional view of a cantilever portion, in which the right side portion thereof from the center broken line is formed by isotropic etching such as dry etching so that a cantilever groove 18 may be formed substantially vertically to the direction of the plane of the interconnection substrate 6, and in which the left side portion thereof from the center broken line is formed by anisotropic etching technique using KOH solution etc. so that the groove 17 may be formed to be tilted with respect to the direction of the plane of the interconnection substrate 6.

Since silicon which is the main constituent of the interconnection substrate 6 is a semiconductor, impurities (such as arsenic and/or phosphorous and/or boron etc.) of about $10^{20}$ atoms/cm$^3$ for enhancing the electric conductivity of silicon itself may be contained in the substrate, or a metallic conductive layer 16 may be formed on the surface of the pyramid-like shape d electrode terminals 7, as shown in FIG. 5. Further, on the surface of the conductive layer 16, a protective layer 15 may be formed. In this case, the respect as to whether or not the surface protective layer 15 is formed has no direct relation to the methods of forming the above explained grooves. Further, to perform the regulating or matching of impedance regarding the whole of the semiconductor device, it is preferred to provide an insulation layer 14 having a thickness of several micron meters to several ten micron meters between the interconnection substrate 6 (formed of silicon) and the conductive layer 16, whereby the high frequency transmission of signals becomes easy.

Further, the reason for using the cantilever structure regarding the electrode terminals 7 is that, by enabling the deflection of the electrode terminals, compressive force is made to be readily applied to portions contacting with the electrode terminals so that electric connection may be stabilized. In this case, since the compressive force is regulated by the structure of the lever and by the amount of the deflection, it is also possible to prevent excessive force from being applied to the contacting portions. The amount of the deflection of the cantilever can be controlled by regulating the relation between the height of the pyramid-like shape d protrusions of the cantilever and the depth of the concave portions 13 for inserting the LSI chips which concave portions are formed in the cover 5.

As described above, according to the first embodiment of the invention, a plurality of LSI chips are mounted on the interconnection substrate having no difference in thermal expansion coefficient with respect to the LSI chips, by use of means distinct from conventional bonding or connecting technique, whereby the exchanging and mounting of the chips can be readily performed and it becomes possible to realize a semiconductor device superior in heat dissipation characteristic. Namely, in the interconnection substrate are provided the plural electrode terminals 7 of the cantilever structure formed on the surface portion of the substrate which surface portion is made of silicon, the interconnection layer 8 for electrically connecting these electrode terminals to each other, the interconnection layer 12 for performing the electric connection to the exterior portions, and the fitting portions 9 to be fitted in the fitting grooves 9' formed on the cover 5 in which the plural LSI chips 1 and 2 are received. The interconnection substrate 6 is connected to the cover 5 through the fitting portions 9. Thus, the LSI chips 1 and 2 are electrically mounted directly through the electrode terminals 7 by contacting, without using any connecting bumps used in conventional bonding or connecting technique.

Further, since the cover 5 and the interconnection substrate 6 are connected to each other by the fitting portions 9, the detachment of them can be readily performed. Thus, when an inferior LSI chip is found in a reliability test etc., the inferior LSI chip can be readily exchanged. In addition, since the main constituent of the interconnection substrate 6 is silicon, the difference in thermal coefficient between the LSI chips 1 and 2 and the interconnection substrate 6 is very low, which make it unnecessary to provide reinforcing resin portions to thereby lower the production cost thereof.

Since the cover 5 and the interconnection substrate 6 is connected by the fitting portions 9, the positioning of both of them can be also readily performed. Accordingly, the positioning between the LSI chips 1 and 2 and the interconnection substrate 6 and the mounting thereof can be readily performed by the steps of inserting the LSI chips 1 and 2 in the cover 5, and superimposing the cover 5 on the interconnection substrate 6 through the fitting portions 9. Further, by forming the cover 5 by use of the material containing silicon as the main constituent thereof, the heat occurring in the LSI chips 1 and 2 can be readily dissipated, so that the heat dissipation characteristic of the whole semiconductor device can be enhanced.

In the first embodiment of the invention, the LSI chips 1 and 2 are in direct contact with the cover 5, however, the LSI chips 1 and 2 may be in a contact relation to the cover 5 through a height-variation-adjusting layer 23 as shown in the second embodiment (FIG. 6) or the third embodiment (FIG. 7) of the invention disclosed herein. In this case, the higher the thermal conductivity of the height-variation-adjusting layer, the more preferred it becomes, however, it is preferred for this layer to have proper flexibility for preventing unnecessary load from occurring.

Further, although the cover 5 and the interconnection substrate 6 are connected through the fitting portion 9 in the first embodiment, both of the cover 5 and the interconnection substrate 6 may be bonded to each other by use of a bonding agent after no occurrence of any defect has been confirmed regarding the LSI chips 1 and 2.

Next, the second embodiment of the invention is described below while referring to FIG. 6.

Figure 6:
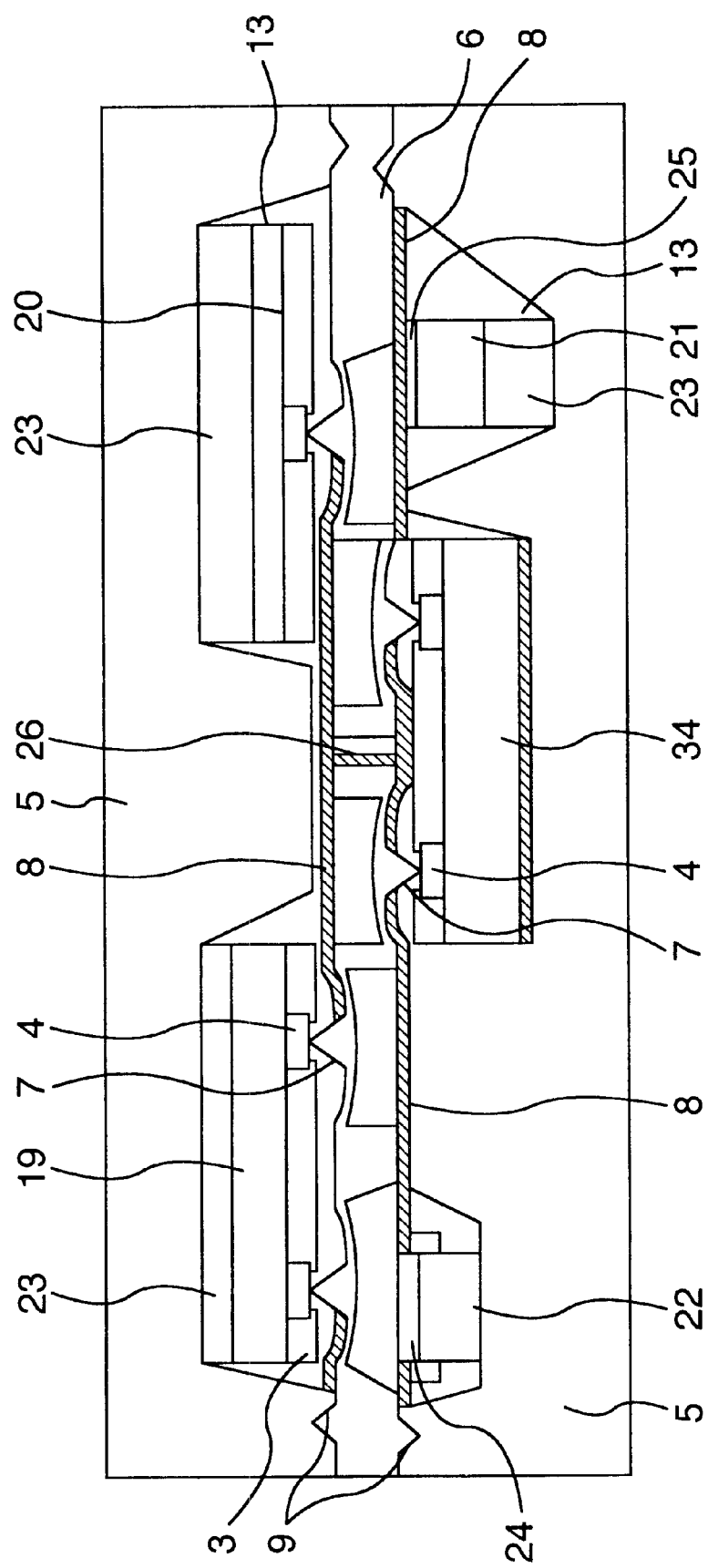
FIG. 6 is a schematic sectional view of another semiconductor device according to the second embodiment of the invention.

FIG. 6 is a schematic sectional view of a semiconductor device according to the second embodiment of the invention. In the second embodiment, there are provided a first silicon cover (a first inner cover) 5 made of a material containing silicon as the main constituent thereof, the first silicon cover 5 having concave portions 13 into which LSI chips 19 and 20 are located, and the first silicon cover 5 is combined with an interconnection substrate 6 through fitting portions 9. The interconnection substrate 6 are provided on a first side thereof with a plurality of electrode terminals 7 (pyramid-like shape d terminals each formed at a portion of a cantilever) each of which is in electrical contact with the outermost surface interconnection layer 4 of the LIS chips 19 and 20 located in the first cover, and an interconnection layer 8 for connecting these electrode terminals 7 to each other. Further, the interconnection substrate 6 is provided on a second side opposite to the first side thereof with a plurality of electrode terminals 7, and another interconnection layer 8 for connecting these electrode terminals 7 to each other. In the interconnection substrate 6 is also provided an interconnection layer 26 for connecting the interconnection layer 8 formed on the first side to the other interconnection layer 8 formed on the second side.

The semiconductor device of the second embodiment is further provided with a second silicon cover (a second inner cover) 5 made of the material containing silicon as the main constituent thereof, the second silicon cover 5 having concave portions 13 into which LSI chip 34 and chip parts 21 and 22 are located through bonding layers 24 and 25, and the second silicon cover 5 is combined with the interconnection substrate 6 through the fitting portions 9. An interconnection layer 4 of LSI chip 34 located in the second silicon cover is in electrical contact with the electrode terminals 7 formed on the second side of the interconnection substrate 6, and the chip parts 21 and 22 are electrically connected to the interconnection layer 8. Further, in order to keep good contact between each of the LSI chips 19, 20 and 34 and the chip parts 21 and 22, and each of the electrode terminals 7, height variation-adjusting layers 23 (made of a material superior in heat conduction which also have good flexibility) are provided in the concave portions 13 of the first and second covers 5. Incidentally, in the second embodiment, an interconnection layer and electrode pads (corresponding to the interconnection layer and the electrode pads 12 disclosed in FIG. 1) for electrically connecting the interconnection layer 8 to exterior portions are also provided although these are not shown in the drawing. Further, an outer cover corresponding to the outer cover 10 having the external electrode terminal 11 disclosed in FIG. 1 is also used in the semiconductor device of the second embodiment although it is not disclosed in the drawing.

Each of the chip parts 21 and 22 is any one of a capacitor, an inductor, a resistor, and a transistor etc., which chip parts make it possible to readily perform decrease in electromagnetic noise at the time of the fast operation.

Thus, according to the second embodiment of the invention, it is possible not only to obtain advantage similar to that of the first embodiment but also to enable mounting of higher density than that of the first embodiment because, in both of the obverse and back faces (, that is, the first and second faces) of the interconnection substrate 6 which are provided with the electrode terminals 7, the LSI chips 19, 20 and 34 and the chip parts 21 and 22 are mounted. Further, since the adjusting layer 23 is made of a material superior in each of the thermal conductivity and flexibility, it is possible to readily perform the mounting of LSI chips having various thickness and electronic parts having various thickness, whereby the heat dissipation of the semiconductor device can be enhanced. Incidentally, specific parts mounted in the interconnection substrate and the number thereof are appropriately decided or selected in accordance with the circuit characteristics of the LSI chips etc., and in the embodiments of the invention these are not limited to the above-described, particular ones.

Figure 7:
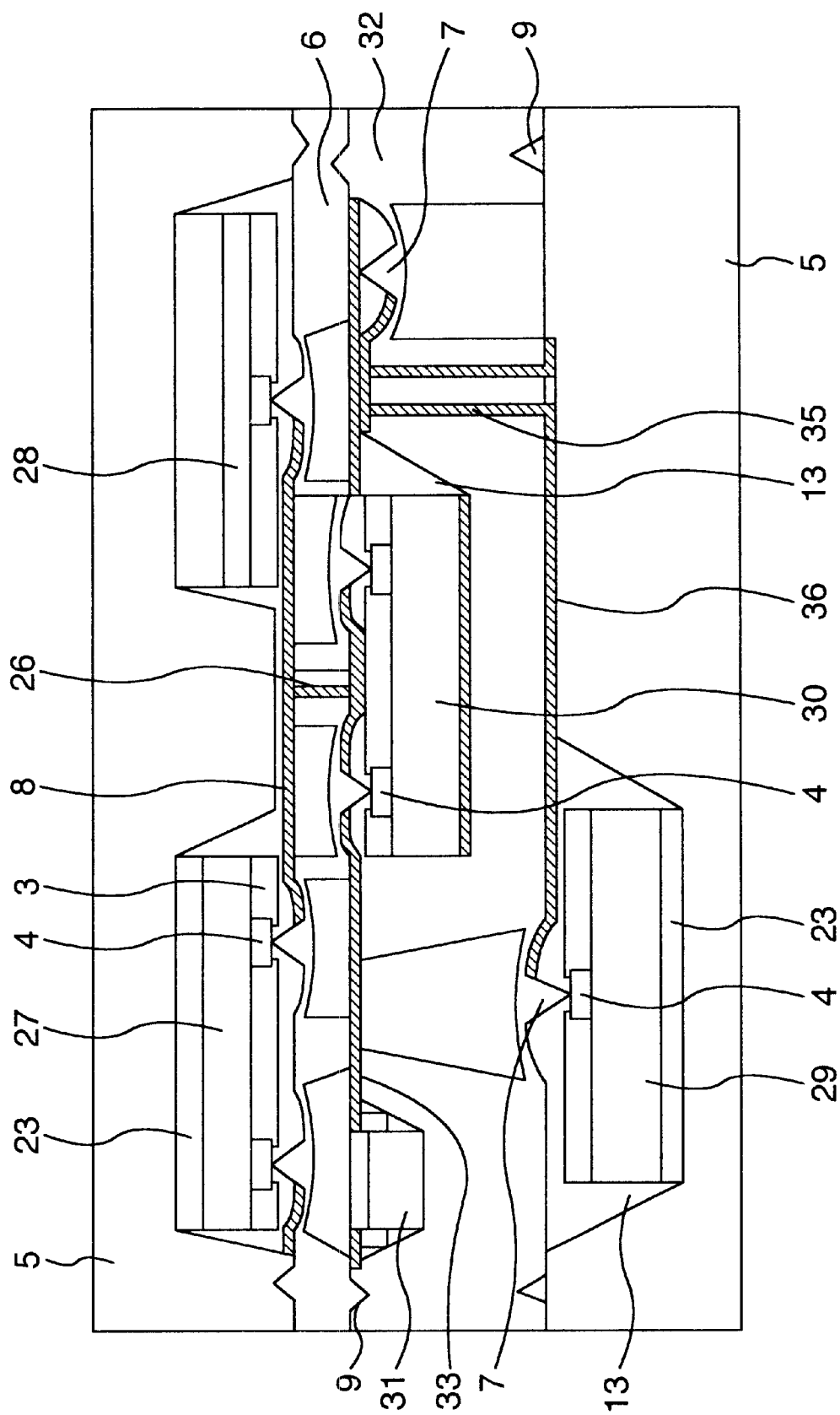
FIG. 7 is a schematic sectional view of still another semiconductor device according to the third embodiment of the invention.

Next, the third embodiment of the invention is described while referring to FIG. 7 which is a schematic sectional view of a semiconductor device according to the third embodiment of the invention. In the third embodiment, since each of a first silicon cover 5 and an interconnection substrate 6 has the same constitution as that of the second embodiment, the detailed description thereof is omitted. However, in FIG. 7, the reference numbers of LSI chips are 27 and 28.

A silicon cover 32 having an interconnection layer is made of a material containing silicon as the main constituent thereof, a LSI chip 30 and a chip part 31 being located in concave portions 13 formed in the silicon cover 32, and the cover 32 is combined with an interconnection substrate 6 through fitting portions 9 at one face thereof. An interconnection layer 4 of the LSI chip 30 located in the silicon cover 32 is in electrical contact with electrode terminals 7 (pyramid-like shape d terminals each formed at a portion of a cantilever) formed at another side of the interconnection substrate 6, and the chip part 31 is electrically connected to the interconnection layer 8.

Further, the silicon cover 32 having the interconnection layer is also provided, at another face opposite to the face combined with the interconnection substrate 6, with a plurality of electrode terminals 7 and an interconnection layer 36 for connecting these electrode terminals 7. In addition, in the silicon cover 32 having the interconnection layers, still another interconnection layer 35 is formed to connect the interconnection layer 33 of the substrate 6 to the interconnection layer 36 formed at the side of another face of the silicon cover, which interconnection layer 35 is connected to the electrode terminals 7 formed at the one face of the silicon cover 32. The electrode terminals 7 are electrically connected to the interconnection layer 8 of the substrate 6.

The semiconductor device according to the third embodiment is further provided with a second silicon cover 5 made of the material containing silicon as the main constituent thereof, the second silicon cover 5 being provided with a concave portion 13 (having an adjusting layer 23) in which a LSI chip 29 is located, and the second silicon cover 5 is combined with the silicon cover 32 through the fitting portions 9. The interconnection layer 4 of the LSI chip 29 located in the second silicon cover 5 is in electrical contact with electrode terminals 7 formed at the side of another face of the silicon cover 32. Incidentally, in the semiconductor device according to the third embodiment are provided an interconnection layer and electrode pads (corresponding to the interconnection layer and the electrode pads 12 shown in FIG. 1) all for electrically connecting the interconnection layer 8 to exterior portions, however, these are not shown in FIG. 7. Further, an outer cover corresponding to the outer cover 10 having external electrode terminals 11 shown in FIG. 1 is also used in the third embodiment, however, the outer cover used in the third embodiment is omitted in FIG. 7.

In the third embodiment of the invention, it is possible to obtain an advantage similar to that of the first embodiment. In addition, the three dimensional, high density mounting of the LSI chips can be readily performed because of the structures that, in the substrate 6 having the electrode terminals 7 formed in each of the obverse and rear faces (, that is, one face and another face) of the substrate, the LSI chips 27, 28 and 30 and the chip part 31 are mounted on both faces of the substrate 6 and that the LSI chip 29 located in the second silicon cover 5 is also connected to the interconnection layer 33 of the interconnection substrate 6 by the silicon cover 32 having the interconnection layers.

Figure 8:
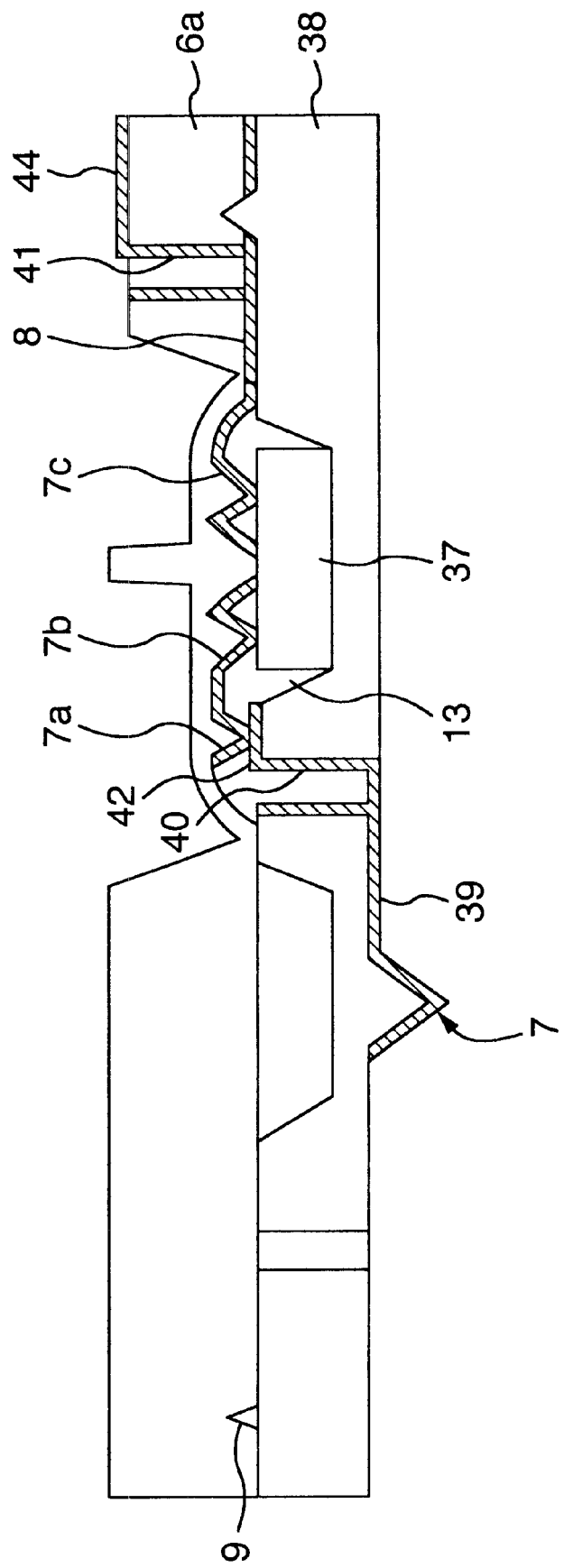
FIG. 8 is a schematic sectional view of still another semiconductor device according to the fourth embodiment of the invention.

Next, the fourth embodiment of the invention is described while referring to FIG. 8, which is a schematic sectional view of a semiconductor device according to the fourth embodiment. The semiconductor device according to the fourth embodiment is an example applied to a semiconductor inspecting device, that is, an inspecting contactor, for performing probing inspection and burn-in inspection etc. of a plurality of semiconductor elements.

Inspections such as the probing inspection and burn-in inspection etc. of the semiconductor elements are explained below. The method for producing the semiconductor elements such as IC and LSI is divided roughly into two steps, that is, a so-called front-end process (wafer process) performing to the extent of forming integrated circuits on the surface of a silicon wafer and a so-called back-end process (assembly and testing process) performing to the extent of cutting-off the silicon wafer into individual chips and encapsulating each of them by use of resin or ceramic etc. In the semiconductor elements, at a predetermined step in the front-end process, the electric characteristic inspection of each of circuits is performed, and the decision as to whether or not good quality is obtained is performed regarding every chip.

The inspections of electric characteristic (inspection of electrical continuity and etc.) are roughly divided into the probing inspection for deciding whether the electrical continuity among circuits is good or not, the burn-in inspection for performing the accelerated sorting-out of inferior chips by applying thermal and electric stress to the circuits at a high temperature of. about 150° C., and a final inspection in which the inspection is finally performed with a high frequency. Particularly, in the final inspection performed with the high frequency, an inspection of high-speed operation is desired in which the inspection by use of high-speed devices are performed with very high frequency. In the various inspections, similar means are used insofar as basic means for connecting a wafer to be inspected or a chip to be inspected to an outer inspection system is concerned. Namely, electrically conductive probes fine in size are individually made to be in mechanical pressure contact with electrode pads of aluminum alloy of another alloy which electrode pads are provided at a pitch from several ten micron meters to several hundreds micron meters on the wafer to be inspected and each of which electrode pads has a shape of square with a side ranging from several tens micron meters to several hundreds micron meters.

As described above, in the inspection of semiconductor elements, the probes are contacted with each of the semiconductor elements to thereby be connected to an external inspection device, whereby the delivery and receipt of signals for performing the inspection are performed between them.

The semiconductor device according to the fourth embodiment of the invention is used as interface means for the delivery and receipt of signals between each of many semiconductor elements to be inspected (wafers to be inspected) and the external inspection device.

In FIG. 8, electrode terminals 7 are formed on one face (a face opposing to the semiconductor element to be inspected, that is, one main face) of a silicon cover 38 having an interconnection layer. Each of the electrode terminals 7 has a pyramid-like shape and is formed at a portion of a cantilever, similarly to the first to third embodiments of the invention. Further, the electrode terminals 7 are connected through interconnection layers 39 and 40 to electrode pads 42 formed on another face of the silicon cover 38. On another face of the silicon cover 38 are formed concave portions 13 similar to those in the first to third embodiments, in one of which concave portions 13 a LSI chip 37 is located. In addition, on the silicon cover 38 are formed fitting portions 9, through which fitting portions both of the silicon cover 38 and the interconnection substrate 6a are combined with each other.

On one face (a face facing the silicon cover 38) of the interconnection substrate 6a, electrode terminals 7a, 7b and 7c are formed each of which is formed at one portion of a cantilever while having a pyramid-like shape, and the electrode terminals 7, 7a and 7b are electrically connected to each other. The electrode terminals 7c are connected to electrode pads 44 (an external terminal) formed on another face of the interconnection substrate 6a.

A LSI chip 37 has a multiplex circuit (semiconductor circuit), so that the LSI chip 37 has such a function as to select a small number of output signals from a large number of input signals. Thus, the LSI chip 37 has a large number of input electrode pads and output electrode pads of a number smaller than the former. Accordingly, although not shown, a large number of ones are formed insofar as the electrode terminals 7a and 7b of the interconnection substrate 6a are concerned, the large number of electrode terminals 7a and 7b being made to be in contact with a large number of input electrode pads of the LSI chip 37. As regards the electrode terminals 7c of the interconnection substrate 6a, a number smaller than that of the electrode terminals 7a or 7b is formed, and the electrode terminals 7c are made to be in contact with the output electrode pads of the LSI chip 37.

As regards the electrode terminals 7 of the silicon cover 38, a large number of ones are located, the large number of electrode terminals 7 being connected to a large number of elements to be inspected, respectively. Also, regarding the electrode pads 42, a large number of one are provided, and the large number of electrode pads 42 corresponds to the large number of electrode terminals 7, respectively. Incidentally, although not shown in the drawing, an outer cover corresponding to the outer cover 10 having the outer electrode terminals 11 shown in FIG. 1 is also used in the fourth embodiment. Further, it is necessary to push the probes 7 against predetermined positions of a wafer to be inspected, which is performed by a pushing substrate (not shown in the drawing).

In the fourth embodiment, the electrode terminals 7b in contact with the pads of the semiconductor circuit are formed in the interconnection substrate 6a, however, the electrode terminals 7a may be formed in the silicon cover 38.

Thus, according to the fourth embodiment of the invention, it is possible to obtain advantages similar to those of the first embodiment and to further realize an inspection contactor used in a semiconductor inspection device which has such a simplified structure as the number of the output pads is made, because of the LSI chip 37 having the multiplex circuit, to be smaller than that of the elements to be inspected.

According to the invention, by mounting the plurality of LSI chips on the interconnection substrate having substantially no difference in thermal expansion coefficient by use of means distinct from conventional bonding or connecting, it becomes possible to readily exchange or mount the chips, and at the same time to realize a semiconductor device and an inspection contactor both superior in heat dissipation.

What is claimed is:

1. An inspection contactor for inspecting electrical continuity of an inspected wafer by pushing probes against a predetermined location of said inspected wafer, said contactor comprising:

a first silicon substrate provided on a main face thereof with said probes;

a second silicon substrate located on another face of said first silicon substrate which another face is opposite to said main face of the first silicon substrate;

a semiconductor circuit having a plurality of electrode pads located on said second silicon substrate;

a third silicon substrate located on said second silicon substrate at a side opposite to the first silicon substrate; and a plurality of outer terminals located on a face of said third silicon substrate which face is opposite to said second silicon substrate;

the number of said outer terminals being smaller than the number of said probes, and each of said plurality of electrode pads located in the semiconductor circuit being electrically connected to said probes or said outer terminals.

2. An inspection contactor according to claim 1, further comprising at least one concave portion formed in a face of said first substrate which face is opposite to said main face of said first silicon substrate, said second silicon substrate being positioned on said opposite face of the first silicon substrate through said at least one concave portion.

3. An inspection contactor according to claim 1, wherein any one of said first and third silicon substrates is provided with electrode terminals each formed to have a pyramid-like shape at a portion of a cantilever, the electrode pads of said semiconductor circuit being electrically connected to said probes or to said outer terminals through said electrode terminals.

4. An inspection contactor according to claim 1, wherein said semiconductor circuit is a multiplex circuit.

5. An inspection contactor according to claim 1, wherein said first silicon substrate is connected to said third silicon substrate by fitting portions.

6. An inspection contactor according to claim 1, wherein terminals on said third silicon substrate face said plurality of electrode pads on said semiconductor circuit, and said terminals on said third silicon substrate are in pressure contact with said plurality of electrode pads based on deflection of said third silicon substrate.

7. An inspection contactor according to claim 1, wherein terminals on said third silicon substrate face said plurality of electrode pads on said semiconductor circuit, and said terminals of said third silicon substrate are formed on a cantilever provided by said third silicon substrate.

8. A contactor for a wafer, comprising:

a first silicon substrate having probes provided on a main face;

a second silicon substrate located on another face of said first silicon substrate opposite to said main face of the first silicon substrate;

a semiconductor circuit having a plurality of electrode pads located on said second silicon substrate;

a third silicon substrate located on a side of said second silicon substrate opposite from said first silicon substrate; and a plurality of outer terminals located on a face of said third silicon substrate opposite from said second silicon substrate;

wherein a number of said outer terminals is smaller than a number of said probes, and each of said plurality of electrode pads of said semiconductor circuit is electrically connected to said probes or said outer terminals.

9. A contactor according to claim 8, further comprising at least one concave portion formed in a face of said first silicon substrate opposite from said main face of said first silicon substrate, said second silicon substrate being positioned on said opposite face of the first silicon substrate through said at least one concave portion.

10. A contactor according to claim 8, wherein any one of said first and third silicon substrates is provided with electrode terminals each formed to have a pyramid-like shape at a portion of a cantilever, the electrode pads of said semiconductor circuit being electrically connected to said probes or to said outer terminals through said electrode terminals.

11. A contactor according to claim 8, wherein said semiconductor circuit is a multiplex circuit.

12. A contactor according to claim 8, wherein said first silicon substrate is connected to said third silicon substrate by fitting portions.

13. A contractor according to claim 8, wherein terminals on said third silicon substrate face said plurality of electrode pads on said semiconductor circuit, and said terminals on said third silicon substrate are in pressure contact with said plurality of electrode pads based on deflection of said third silicon substrate.

14. A contactor according to claim 8, wherein terminals on said third silicon substrate face said plurality of electrode pads on said semiconductor circuit, and said terminals of said third silicon substrate are formed on a cantilever provided by said third silicon substrate.

* * * * *